United States Patent [19]
Terao et al.

[11] Patent Number: 4,866,672
[45] Date of Patent: Sep. 12, 1989

[54] INFORMATION-RECORDING THIN FILM AND METHOD FOR RECORDING AND REPRODUCING INFORMATION

[75] Inventors: Motoyasu Terao, Tokyo; Tetsuya Nishida, Kokubunji; Yasushi Miyauchi, Hachioji; Shinkichi Horigome, Tachikawa, all of Japan

[73] Assignee: Hitachi, Ltd., Tokyo, Japan

[21] Appl. No.: 271,358

[22] Filed: Nov. 14, 1988

Related U.S. Application Data

[63] Continuation of Ser. No. 188,079, Apr. 28, 1988, abandoned, which is a continuation of Ser. No. 893,829, Aug. 6, 1986, abandoned.

[30] Foreign Application Priority Data

Aug. 9, 1985 [JP] Japan ............... 60-174110
Oct. 14, 1985 [JP] Japan ............... 60-226723
Jun. 27, 1986 [JP] Japan ............... 61-149503

[51] Int. Cl.$^4$ ........................... G11C 13/00
[52] U.S. Cl. .................... 365/151; 365/113; 369/94; 369/283; 369/288
[58] Field of Search ............ 365/107, 108, 151, 113; 369/94, 100, 272, 275, 283, 284, 288

[56] References Cited

U.S. PATENT DOCUMENTS 3,668,663 6/1972 Chandross et al. ............... 365/107

OTHER PUBLICATIONS

Japanese Patent Application Kokai (Laid-Open), No. 57-24039, Laid Open 2 Feb 1982, from Japanese Patent Application 55-99253, filed 18 Jul. 1980, by Sato.

Primary Examiner—Terrell W. Fears
Attorney, Agent, or Firm—Antonelli, Terry & Wands

[57] ABSTRACT

An information-recording thin film provided on a substrate directly or through a protective layer has an average composition of the thin film being represented by the general formula;

$$A_X B_Y C_Z D_\alpha E_\beta F_\gamma$$

wherein X, Y, Z, $\alpha$, $\beta$ and $\gamma$ are in ranges of $0 \leq X < 30$, $0 \leq Y \leq 60$, $3 \leq Z \leq 70$, $30 \leq \alpha \leq 80$, $0 \leq \beta \leq 60$ and $0 \leq \gamma \leq 67$ in atomic percentage, F is at least one element of As, Sb, Si and Ge; E is at least one element of Cu, Ag, Au, Sc, Y, Ti, Zr, V, Nb, Cr, Mo, Mn, Fe, Co, Rh, Ni, and Pd; D is at least one element of Se and S; C is at least one element of Sn, Pb, Bi, Zn, Cd, Ga and In; B is at least one element of Tl, halogen elements and alkali metal elements; and A is at least one of other elements than those represented by B, C, D, E and F, and records information through changes in the atomic configuration.

6 Claims, 2 Drawing Sheets

INFORMATION-RECORDING THIN FILM AND METHOD FOR RECORDING AND REPRODUCING INFORMATION

This application is a Continuation of application Ser. No. 188,079, filed Apr. 28, 1988 which is a Continuation of application Ser. No. 893,829, filed Aug. 6, 1986.

BACKGROUND OF THE INVENTION

This invention relates to an information-recording thin film capable of recording frequency modulated analog signals such as images, voices, etc. or digital information such as electronic computer data, facsimile signal, digital audio signal, etc. in real time by a recording beam, such as laser beam, electron beam, etc.

Principles of recording on a thin film by a laser beam are various, and the recording based on changes in atomic configuration such as phase transition (which may be also called "phase change") of film material, photo-darkening, etc. brings about no substantial deformation of the film, and thus has such an advantage that a two-side disk can be obtained by directly bonding two disks. Furthermore, rewriting of recording is possible by properly selecting a composition. Many inventions of such recording have been so far made, and one of the earliest ones is disclosed in U.S. Pat. No. 3,530,441, where many thin films of Te-Ge, As-Te-Ge, Te-O, etc. are mentioned. Japanese Patent Application Kokai (Laid-Open) No. 54-41902 discloses various film compositions such as $Ge_{20}Tl_5Sb_5Se_{70}$, $Ge_{20}Bi_{10}Se_{70}$, etc., and Japanese Patent Application Kokai (Laid-open) No. 57-24039 discloses films of $Sb_{25}Te_{12.5}Se_{62.5}$, $Cd_{14}Te_{14}Se_{72}$, $Bi_2Se_3$, $Sb_2Se_3$, $In_{20}Te_{20}Se_{60}$, $Bi_{25}Te_{12.5}Se_{62.5}$, CuSe and $Te_{33}Se_{67}$. However, all of these prior art thin films have disadvantages, when used as once-writable (write-once) or rewritable (reversible) phase transition recording film, such as low crystallization speed, less absorption of semi-conductor laser beam and consequent poor sensitivity, inadequate reproduced signal intensity, poor stability of amorphous state and poor oxidation resistance, and there have been problems in their practical applications.

SUMMARY OF THE INVENTION

An object of the present invention is to provide an improved information-recording thin film and a method for recording and reproducing information by the said thin film.

Another object of the present invention is to provide an information-recording thin film with good recording and reproducing characteristics, high sensitivity and high stability, and a method for recording and reproducing information by the said thin film.

These objects and other objects can be attained with an information-recording thin film capable of changing an atomic configuration upon exposure to a recording beam, formed on a substrate directly or through a protective layer composed of at least one of inorganic materials and organic materials, the average composition in the film thickness direction of the information-recording thin film being represented by the following general formula:

$$A_X B_Y C_Z D_\alpha E_\beta F_\gamma$$

wherein X, Y, Z, $\alpha$, $\beta$, and $\gamma$ are in ranges of $0 \leq X < 30$, $0 \leq Y \leq 60$, $3 \leq Z \leq 70$, $30 \leq \alpha \leq 80$, $0 \leq \beta \leq 60$ and $0 \leq \gamma \leq 67$ in atomic percentage, F is at least one element of As, Sb, Si and Ge; E is at least one element of Cu, Ag, Au, Sc, Y, Ti, Zr, V, Nb, Cr, Mo, Mn, Fe, Co, Rh, Ni, and Pd; D is at least one element of Se and S; C is at least one element of Sn, Pb, Bi, Zn, Cd, Ga and In; B is at least one element of Tl, halogen elements and alkali metal elements; and A is at least one of other elements than those represented by B, C, D, E and F, and by a method for recording and reproducing information, using the said thin film.

DETAILED DESCRIPTION OF PREFERRED EMBODIMENTS

Figure 1:
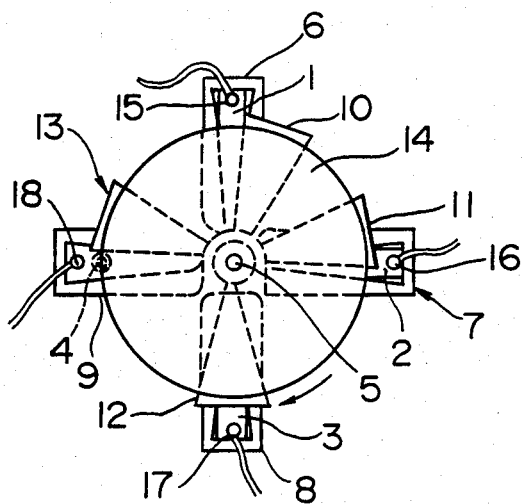
FIG. 1 shows an internal structure of a vacuum evaporation equipment for use in preparation of the present recording member.

The element represented by A in the general formula includes, for example, Hg, Al, B, C, N, P, O, Te, lanthanide elements, actinide elements, alkaline earth metal elements, inert gas elements, etc., at least one of which can be used. One element or a plurality of elements from those represented by B, C, D, E and F can be deemed as group A elements, insofar as other elements of the said individual groups B, C, D, E and F have been already used. For example, S can be added to a Tl-In-Se system in an amount of less than 30 at. % of S and in such a range that the sum total of S content and Se content be less than 80 at. % of the upper limit of the content of the group D elements. Among these elements, it is preferable that the content of Al, Hg, alkaline earth metal elements and inert gas elements be less than 10 at. %.

The composition of the present recording thin film may be changed in the film thickness direction, so far as the average composition in the film thickness direction is kept within the said range, and it is preferable that the composition changes continuously.

The recording is carried out with an energy beam having such a power for such an irradiation time as to cause a change from one phase to another without any large deformation of the recording thin film.

The elements of the said individual groups play the following roles: the elements such as Sn, etc., represented by C and Se and S represented by D can maintain the amorphous state stably when contained in appropriate ratios. For example, a ratio of In to Se by atom is preferably in a range of 1:0.6 to 1:2, a ratio of Sn to Se by atom preferably in a range of 1:1 to 1:2.5, a ratio of Ga to Se by atom preferably in a range of 1:0.6 to 1:1.4, and a ratio of Bi to Se by atom preferably in a range of 1:0.4 to 1:0.9.

Elements such as, etc., represented by F can effectively increase the stability of amorphous state when contained together with Se or S, but the crystallization speed at recording and erasing will be lowered if their content is inadequate. For example, as to Sb, it is preferable that a ratio of Sb to Se by atom is in a range of 1:0.4 to 1:0.9.

Elements such as Co, etc. represented by E can facilitate absorption of long wavelength light such as semiconductor laser beam, etc., and can also effectively increase the recording sensitivity and enhance the crystallization temperature, consequently the stability of amorphous state. The elements themselves have a higher melting point than 600° C., or can form compounds of higher melting point, and thus undergo no melting when elevated to a high temperature in crystallization by a laser beam. Thus, the high speed crystallization can be attained.

Elements such as Tl, etc. represented by B can effectively increase the crystallization speed. When the group B element and the group E element are contained together, high speed crystallization can be attained with a good stability of amorphous state and a high recording sensitivity.

Elements such as Te, etc., represented by A have no particularly remarkable effect by their addition, and have no large adverse effect so far as added in a small amount. Among them, Te, etc. have role of optimizing the light transmissivity of a thin film, increasing the reproduced signal intensity, and increasing the crystallization temperature.

The present information-recording thin film within the said composition range has a distinguished recording and reproducing characteristics with a low power laser beam for recording and erasing and also has a good stability.

More preferable ranges for X, Y, Z, $\alpha$, $\beta$ and $\gamma$ are as follows: a range of $0 \leq X + \beta > 30$, $0 \leq Y \leq 60$, $20 \leq Z + \gamma \leq 70$ and $30 \leq \alpha \leq 80$, and also a range of $0 \leq X + Y + \alpha < 30$, $3 \leq Z \leq 60$, $30 \leq \alpha \leq 80$ and $1 \leq \beta \leq 60$. In the latter range, it is more preferable that a condition of $20 \leq Z + \gamma \leq 70$ be satisfied in $1 \leq \beta < 30$. In these two ranges, $0 \leq \gamma < 10$ is more preferable.

A particularly preferable range for X, Y, Z, $\alpha$, $\beta$, and $\gamma$ is as follows: a range of $0 \leq X + \beta < 20$, $1 \leq Y \leq 30$, $25 \leq Z + \gamma \leq 60$, and $35 < \alpha \leq 70$. In this range, $0 \leq \alpha < 10$ is more preferable.

Most preferable range for X, Y, Z, $\alpha$, $\beta$ and $\gamma$ is as follows: a range of $0 \leq X < 5$, $2 \leq Y \leq 15$, $25 \leq Z + \gamma \leq 60$, $35 \leq \alpha \leq 70$ and $3 \leq \beta \leq 15$. In this range, $0 \leq \gamma < 10$ is more preferable.

Among the elements represented by C, In is particularly preferable, and Sn is next preferable. Among Se and S represented by D, a thin film containing more Se is preferable. However, S is preferable because of the absence of toxicity. Among the elements represented by E, Co and Ni are particularly preferable, and Ti, V, Cr Mn, Au and Zr are next preferable. Among the elements represented by B, Tl is particularly preferable, I is next preferable, and then other halogen elements such as Cl, etc. are preferable. Among the elements represented by A, Te is preferable. Among the elements represented by F, Sb is particularly preferable, Si is next preferable, and then As is preferable.

Changes in the contents of individual elements in the film thickness direction are usually small, and the presence even of any patternwise change is not objectionable. As to Se and S, it is preferable that the contents of Se and S are increased in the neighborhood of one of the boundaries of a recording thin film (including a boundary to other layer), as compared with those at the inside, and the oxidation resistance can be increased thereby.

It is preferable that at least one side of the present recording film is tightly covered and protected with other material, and it is more preferable to protect the two sides. The protective layer may be composed of a synthetic resin (organopolymer compound) plates such as acrylic resin plate, polycarbonate plate, epoxy resin plate, etc. which serve also as a substrate, or organic materials such as acrylic resins, epoxy resins, polyimides, polyamides, polystyrene, polyethylene, fluorine-containing resins, e.g. tetrafluoroethylene (Teflon), etc., or may be composed of inorganic materials containing oxides, fluorides, nitrides, sulfides, carbides, borides, boron, carbon or metals as the main component, or may be composed of their composite materials. A substrate composed of glass, quartz, sapphire, iron, titanium, or aluminum as the main component can work as an inorganic protective layer. Among the organic and inorganic materials, tight covering with the inorganic materials is preferable with respect to the heat resistance. However, a thicker inorganic material layer (excluding the application as a substrate) is liable to cause at least one of crack development, decrease in transmissivity, and decrease in sensitivity, and thus the inorganic material layer must be made thinner, and it is preferable to tightly cover the opposite side of the inorganic material layer to the recording film side with a thicker organic material layer to increase the mechanical strength. The organic material layer may be a substrate. Deformation can be made less thereby. The organic materials for use to this end include, for example, polystyrene, polytetrafluoroethylene (Teflon), polyimides, polycarbonate, epoxy resin, ethylene-vinyl acetate copolymer, etc. known as hot-melt adhesives, and tackifying agents, etc. UV light curing resin may be used. A protective layer composed of inorganic materials can be formed as such by electron beam deposition, sputtering, etc. or can be more readily formed by reactive sputtering, or by forming a film composed of at least one element of metals, semi-metals and semiconductors, and reacting the film with at least one of oxygen, sulfur and nitrogen. Inorganic material protective layers are composed of, for example, oxides of at least one element selected from the group consisting of Ce, La, Si, In, Al, Ge, Pb, Sn, Bi, Te, Ta, Sc, Y, Ti, Zr, V, Nb, Cr, and W, sulfides or selenides of at least one element selected from the group consisting of Cd, Zn, Ga, In, Sb, Ge, Sn, and Pb, fluorides of Mg, Ce, Ca, etc., nitrides of Si, Al, Ta, B, etc., borides of Ti, etc., carbides of Si, etc., and boron and carbon, and the main component has a composition approximating to one of, for example, $CeO_2$, $La_2O_3$, SiO, $SiO_2$, $In_2O_3$, $Al_2O_3$, GeO, $GeO_2$, PbO, SnO, $SnO_2$, $Bi_2O_3$, $TeO_2$, $WO_2$, $WO_3$, $Ta_2O_5$, $Sc_2O_3$, $Y_2O_3$, $TiO_2$, $ZrO_2$, CdS, ZnS, CdSe, ZnSe, $In_2S_3$, $In_2Se_3$, $Sb_2S_3$, $Sb_2Se_3$, $Ga_2S_3$, $Ga_2Se_3$, $MgF_2$, $CeF_3$, $CaF_2$, GeS, GeSe, $GeSe_2$, SnS, SnSe, PbS, PbSe, $Bi_2Se_3$, $Bi_2S_3$, TaN, $Si_3N_4$, AlN, Si, $TiB_2$, $B_4C$, SiC, B and C.

Among these materials, nitrides have not so high surface reflectivity and can produce a stable film, and a composition approximating to TaN, $Si_3N_4$ or AlN is preferable with respect to rigidity. Preferable oxides have a composition approximating to $Y_2O_3$, $Sc_2O_3$, $CeO_2$, $TiO_2$, $ZrO_2$, $In_2O_3$, $Al_2O_3$, $SnO_2$ or $SiO_2$. Double or multilayered protective layers of inorganic materials of which each layer has different thermal conductivity or Young's modules are more preferable. Amorphous materials of Si or C containing hydrogen are also preferable. By formation of a protective film as mentioned above, an increase in noise by deformation of a recording film at recording and rewriting can be prevented.

When recording is carried out by phase transition (change), it is preferable to crystallize the entire surface of a recording film in advance, but in the case of a substrate composed of an organic material, it is impossible to bring the substrate to a high temperature, and thus crystallization must be carried out in other manner. That is, it is preferable that crystallization is carried out by exposure to a laser beam, or an electron beam condensed to a spot diameter of 2 μm or less, exposure to UV light from a xenon lamp, a mercury lamp, etc. together with heating, exposure to light from a flash lamp, exposure to a large light spot from a high power gas laser, or a combination of exposure to laser beam and heating, etc. In the case of exposure to light from a gas laser, a good crystallizing efficiency can be obtained with a light spot diameter (half-width) of 5 μm to 5 mm. Crystallization may be carried out only on the recording track, while keeping the intertrack spaces in an amorphous state. Crystallization can be also carried out only on the intertrack spaces. For example, when a film composed of In and Se as the main components is formed from a plurality of evaporation sources by rotating vapor deposition, In and Se are not substantially in a combined state right after the vapor deposition. In that case, the recording track is exposed to a laser beam of high power density to melt the film, if any, to allow the individual elements to react with one another. When the recording is carried out by formation of amorphous state, the recording track is further exposed to a laser beam of low power density to effect crystallization. It is also possible to record on a recording thin film in an amorphous state by crystallization.

When a thin film is exposed to light, the reflected light is generally a superposition of a reflected light from the thin film surface and another reflected light from the back side of the thin film, and thus undergoes an interference. When a signal is read through changes in the reflectivity, the effect of interference is increased by providing a reflecting (absorbing) layer near the recording film, and consequently the read-out signal can be intensified. To more increase the effect of interference, it is preferable to provide an intermediate layer between the recording film and the reflecting (absorbing) layer. The intermediate layer is also effective for preventing mutual diffusion between the recording film and the reflecting layer at the recording and rewriting. It is preferable to use a material less capable of absorbing the read-out light in the intermediate layer. It is also preferable that the intermediate layer has a thickness of 3 nm to 400 nm, selected so that the reflectivity of the recording member can become a minimum at the wavelength of read-out light in a recorded or erased state. The reflecting layer can be formed between the recording film and the substrate, or on the opposite sides of the recording film. Particularly preferable thickness of the intermediate layer is in a range of 5 nm to 40 nm. It is also preferable to form a protective layer composed of the said inorganic material on the opposite side of the reflecting layer to the intermediate layer.

The reflecting layer is capable of increasing the thermal conductivity and effective for ensuring formation of amorphous state when exposed to a laser beam of high power, even if a recording film undergoing high speed crystallization is used. In that case, it is particularly preferable to use an $Al_2O_3$, etc. of high thermal conductivity even for the intermediate layer, or make the intermediate layer thinner, or eliminate it.

The present recording film can be dispersed in the oxides, fluorides, nitrides, organic materials, etc., or carbon or carbides mentioned above to be applicable as a protective layer by co-vapor deposition or cosputtering, whereby in some cases the light absorption coefficient can be adjusted or the reproduced signal intensity can be increased. Preferable mixing ratio is such that a proportion of oxygen, fluorine, nitrogen, and carbon in the entire film be 40 at. % or less. By making a composite film in this manner, usually the crystallization speed is lowered and the sensitivity is lowered. However, the sensitivity is increased by making a composite film with an organic material.

Preferable ranges for the thickness of the individual members are as follows:

Recording film: for a monolayer structure film, 60 to 500 nm, particularly preferably 80 to 150 nm and 180 to 300 nm with respect to the reproduced signal intensity; for two or more layer-structure film containing a reflecting layer: 15 to 50 nm;

Protective layer of inorganic material: 5 nm to 300 nm; in the case of protection by a substrate of inorganic material itself, 0.1 to 20 mm;

Protective layer of organic material: 10 nm to 10 mm;

Intermediate layer: 3 to 400 nm;

Light-reflecting layer: 5 to 300 nm

The foregoing individual layers can be formed by vacuum evaporation, evaporation in a gas, sputtering, ion beam sputtering, ion beam deposition, ion plating, electron beam deposition, casting, spin coating, plasma polymerization, etc. upon proper selection.

In the present recording film, it is not always necessary to utilize a change between the a morphous state and the crystalline state in recording, but it is possible to utilize a change in the optical property by any change in the atomic configuration.

The present recording member can be used not only in a disk form, but also in a tape form, a card form or in any other form.

The present invention will be described in detail below, referring to Examples.

EXAMPLE 1

Figure 4:
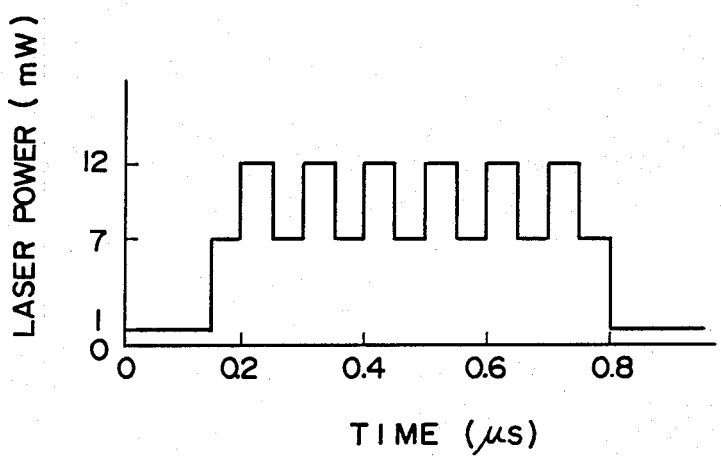
FIG. 4 is a diagram showing a recording laser wave form for the overwriting according to one embodiment of the present invention.

A UV light curing resin replica layer of tracking grooves serving also as a protective layer was formed on the surface of a disk form, chemically reinforced glass plate. The glass disk was 13 cm in diameter and 1.2 mm thick, and one track was divided into 32 sectors, and track addresses and sector addresses were formed in the form of concave and convex pits at the individual intermediate summit parts between the grooves at the starting points of the individual sectors (these parts will be hereinafter referred to as "headers"). At first a $SiO_2$ layer, about 100 nm thick, as a reflection-preventing layer serving also as a protective layer was formed on a substrate 14 by magnetron sputtering. Then, the substrate was disposed in a vacuum evaporation apparatus having an internal structure as shown in FIG. 1, and 4 evaporation sources 1, 2, 3 and 4 were provided in the evaporation apparatus. Three of the evaporation sources were evaporation boats by resistance heating and one thereof is an electron beam evaporation source. These boats and electron beam evaporation source were provided under parts on the substrate 14 destined to record information and substantially on a circumference concentric with the center axis of rotation of the substrate. In and Se were placed in the two evaporation boats, respectively, and Tl was placed in the electron beam evaporation source. Between the individual boats and the substrate there were provided masks 6, 7, 8 and 9 having a sector slit and shutters 10, 11, 12 and 13. The substrate 14 was set to rotate at 120 rpm, while an electric current was passed to the individual boat and a electron beam was irradiated onto the electron beam evaporation source to evaporate the source materials. Tl could be also evaporated from an evaporation boat by resistance heating.

The evaporating rates from the individual evaporation sources were detected by quartz-crystal type film thickness monitors 15, 16, 17 and 18 to control the electric current thereby to make the evaporation rates constant.

Figure 2:
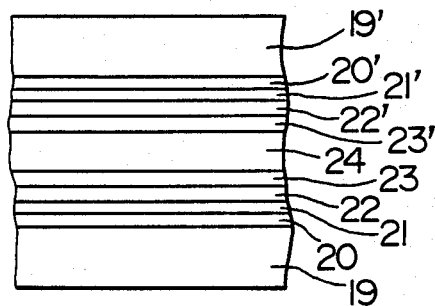
FIG. 2 and FIG. 3 are cross-sectional views of structures of recording members according to embodiments of the present invention.

As shown in FIG. 2, a recording film 21 having the composition of $Tl_5In_{45}Se_{50}$ was vapor deposited to a film thickness of about 250 nm on the $SiO_2$ layer 20 on the substrate 19. The film thickness was such that the light reflected on the interface of the recording film with the substrate-side protective layer interfered with the light reflected on the back side of the recording film and the reflectivity became substantially a minimum at the wavelength of laser beam used for the read-out when the recording film was in an amorphous state or in a poorly crystallized state. Then, a protective layer 22 having a composition substantially equal to $SiO_2$ was successively formed to a film thickness of about 100 nm thereon also by magnetron sputtering. Likewise, a protective layer 20' having a composition substantially equal to $SiO_2$ on a similar substrate 19', and a recording film 21' having the composition of $Tl_5In_{45}Se_{50}$ and a protective layer 22' having a composition substantially equal to $SiO_2$ were successively vapor deposited thereon. UV light curing resin protective layers 23 and 23' were formed to a film thickness of about 50 μm by coating on the respective outermost vapor-deposited layer of the thus obtained two substrates 19 and 19', and the substrates 19 and 19' were joined together by pasting through an organic adhesive layer 24 so that the UV light curing resin layers 23 and 23' could be faced inwardly. In this manner, a disk could be prepared.

The thus prepared disk was heated at 150° C. for about one hour, and then exposed to argon ion laser beams (wavelength: 488 nm) condensed by lenses having a numerical aperture of 0.05 at both sides of the disk while rotating and radially moving the disk, thereby thoroughly crystallizing the recording films 21 and 21'.

Recording was carried out in the following manner:

The disk was rotated at 1,200 rpm, and one of the recording films was exposed to a beam of semi-conductor laser (wavelength: 820 nm), kept at a non-recording power level and condensed by a lens in the recording head, through the substrate. The reflected light was detected to drive the head so that the center of the light spot could always fall onto the intermediate part between the tracking grooves, whereby the influence of noises generated from the grooves could be prevented. Automatic focusing was carried out so that the focus could fall on the recording film while conducting the tracking in this manner, and recording was carried out by intensifying the laser power and returning it to the original level according to information signals. Recording was also carried out by jumping into another groove, when required.

By the foregoing recording, a change of reflectivity was brought about, which seemed to be due to a change into an amorphous state in the recording film. In the foregoing recording film, the recording could be erased by exposure to a recording light spot with a reduced power or another laser beam whose length in the trade direction was longer than the recording light spot and whose extension in the adjacent track direction was substantially equal to the recording light spot. When the pit distance between the nearest pits, which expressed an address, was ½ to 2 times the length in the track direction of the erasing light spot, the address of tracks or sectors could be read even by the erasing light spot. It was preferable that the length of pits which expressed the address was at least ½ of the length in the track direction of the erasing light spot. This was also true of other pits provided on the header. Recording and erasing could be carried out in repetitions of at least $3 \times 10^5$. Without the $SiO_2$ layers over and below the recording films, the noise was slightly increased after a few repetitions of recording and erasing.

Read-out was carried out in the following manner.

The disk was rotated at 1,200 rpm, and the intensity of reflected light of semi-conductor laser beam for reading with such a low power not enough to effect recording and erasing was detected to reproduce information, while conducting the tracking and autofocusing in the same manner as in the recording. In this Example, reproduced signal power of about 100 mV was obtained. The recording film according to this Example had a good oxidation resistance. For example, the recording film without formation of the $SiO_2$ protective layer was not substantially oxidized even if placed at 60° C. and a relative humidity of 95%.

In the foregoing recording film of Tl-In-Se system, necessary recording laser beam power and reproduced signal intensity were changed as follows, with respect to the amount of added Te in X% when Te was added while keeping a ratio of other elements constant.

Recording laser beam power

| | |
|---|---|
| X = 0 | 14 mW |
| X = 1 | 14 mW |
| X = 3 | 12 mW |
| X = 5 | 10 mW |
| X = 10 | 10 mW |

Necessary irradiation time for erasing was as given below:

Necessary irradiation time for erasing

| | |
|---|---|
| X = 0 | 0.5 μs |
| X = 5 | 0.5 μs |
| X = 10 | 0.7 μs |
| X = 20 | 0.9 μs |
| X = 30 | 2 μs |
| X = 40 | 4 μs |

When the In content was changed while keeping a ratio of other elements constant and the temperature was increased at a constant rate, the crystallization temperature was changed as follows:

Crystallization temperature

| | |
|---|---|
| Z = 0 | 80° C. |
| Z = 20 | 120° C. |
| Z = 25 | 200° C. |
| Z = 50 | 250° C. |
| Z = 60 | 200° C. |
| Z = 70 | 120° C. |
| Z = 80 | Crystallized just after the film formation |

When the Se content was changed while keeping a ratio of other elements constant and the temperature was increased at a constant rate, the crystallization temperature was changed as follows:

Crystallization temperature

| $\alpha = 20$ | Crystallized just after the film formation |
|---|---|
| $\alpha = 30$ | 120° C. |
| $\alpha = 35$ | 200° C. |
| $\alpha = 70$ | 200° C. |
| $\alpha = 80$ | 120° C. |

When a portion or all of Se was replaced with S, it was difficult to form a low noise film, and the crystallization temperature was a little lowered, but the toxicity was reduced.

When the content of Tl (thalium) was changed while keeping a ratio of other elements in the recording film of Tl-In-Se system constant, the crystallization temperature and the necessary irradiation time for erasing were changed as follows:

Necessary irradiation time for erasing

| $Y = 0$ | 1.0 $\mu$s |
|---|---|
| $Y = 1$ | 0.5 $\mu$s |
| $Y = 2$ | 0.3 $\mu$s |
| $Y = 15$ | 0.3 $\mu$s |

Crystallization temperature

| $Y = 0$ | 250° C. |
|---|---|
| $Y = 15$ | 230° C. |
| $Y = 30$ | 200° C. |
| $Y = 60$ | 120° C. |
| $Y = 70$ | Crystallized just after vapor deposition |

Deterioration by oxidation when left standing for a time before the deposition of the protective layer thereon was remarkable when the Tl content exceeded 15 at. %.

Addition of other elements represented by A was also effective for some increase in the sensitivity. Even addition of elements such as Co, Au, etc. represented by E in place of Te had a similar effect and their preferable ranges for the amount of added elements was similar, but the amount of less than 1 at. % was preferable with respect to the SN ratio.

Preferable film thickness of the recording film was in ranges of 80 to 150 nm and 180 to 300 nm, where the change of reflectivity by recording became larger owing to the effect of light interference. In a range of 180 to 300 nm, the recording sensitivity was higher. In a range of 80 to 150 nm, the SN ratio was higher. Recording and reproduction were also possible in a range of 15 to 500 nm.

When at least one element of Pb, Bi, Zn, Cd, Sn, and Ga was added in place of a portion or all of In, quite similar characteristics were obtained with a little poor SN ratio. When at least one element of As, Sb, Si, and Ge was also added in place of a portion or all of In, quite similar characteristics were obtained with a little lower erasing speed. Sn was a preferable element among them. When the recording sensitivity and the erasing speed characteristics were taken into account, a particularly preferable ratio of In to Se was in a range 1:0.6 to 1:2 by number of atoms, that of Sn to Se was in a range of 1:1.2 to 1:2.5 by numbers of atom, and that of Bi or Sb to Se was in a range of 1:0.4 to 1:0.9 by numbers of atom.

When at least one element of halogens and alkali metals was added in place of a portion or all of Tl, quite similar characteristics were obtained. I was particularly preferable among the halogens F, Cl, Br and I, and Cl is next preferable. Na was particularly preferable among the alkali metals Li, Na, K, Rb and Cs, and K was next preferable.

In place of $SiO_2$ as a protective film, SiO, $Y_2O_3$, $ZrO_2$, $TiO_2$, nitrides such as TaN, AlN, etc., sulfides such as $Sb_2S_3$, etc., fluorides such as $CeF_3$, etc., and compositions similar to amorphous Si, $TiB_2$, $B_4C$, B, C, etc. could be also used. When a SN ratio was taken into account, a most preferable composition range for the recording film of Tl-In-Se system was $3 \leq Tl \leq 12$, $43 \leq In \leq 60$ and $35 \leq Se \leq 48$, and could contain small amounts of other elements.

EXAMPLE 2

Figure 3:
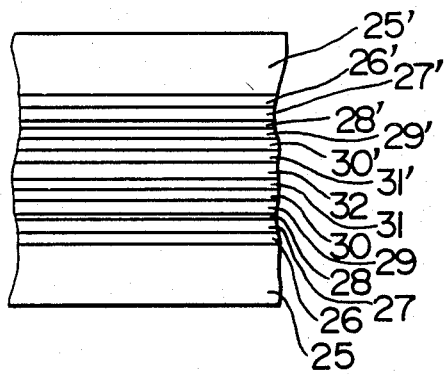

A polycarbonate plate having tracking grooves on the surface, formed by injection molding, was used as a substrate 25, as shown in FIG. 3, and a protective film 26, 40 nm thick, having a composition substantially recording film 27, 30 nm thick, having a composition of $Tl_{10}Sn_{40}Se_{50}$ was formed thereon. Successively, an intermediate layer 28, 20 nm thick, having a composition substantially equal to $SiO_2$, then a reflecting layer 29, 60 nm thick, having a composition of $Bi_7Sb_3$, and a protective layer 30, 40 nm thick, having a composition substantially equal to $SiO_2$ were formed thereon. Likewise, another substrate 25' with various similar layers 26', 27', 28', 29' and 30' thereon was prepared, and polyimides 31 and 31', each about 0.5 $\mu$m thick, were formed by sputtering on the outermost $SiO_2$ layers 30 and 30' of both substrates, respectively, and a disk was prepared by joining the two substrates together by pasting with a hot melt adhesive 32 containing a black pigment, so that the polyimide layers could be faced inwardly. When polyimide layers were further formed on the outside surfaces of polycarbonate plates by sputtering, a more stable disk could be obtained.

Crystallization, recording, erasing and read-out were carried out in the same manner as in Example 1.

Other inorganic transparent materials such as $GeO_2$, $Al_2O_3$, $CeO_2$, $Y_2O_3$, SiO, AlN, TaN, etc. as mentioned to be applicable as a protective layer in Example 1, or an organic material layer could be used for the intermediate layer in place of $SiO_2$. When the intermediate layer had a film thickness of 3 to 40 nm, a mutual diffusion between the recording film and the reflecting layer could be prevented at the recording and rewriting, but optically it could be regarded that there was substantially no intermediate layer. That is, a dependence of reflectivity on wavelength due to the light interference was similar to that of a two-layer structure of recording film and reflecting layer.

When the reflecting layer also underwent an atomic configuration change at the recording, the reproduced signal was a little intensified.

A portion or all of the individual elements represented by C, D and E, contained in the recording film, could be replaced with at least one of other elements in the same groups. For example, $Ni_{10}Sn_{30}Se_{60}$ had a similar result. At least one of the elements in groups A, such as Te, etc. could be added in an amount of not more than 30 at. % without any trouble. However, not more than 20 at. % thereof was preferable with respect to the SN ratio.

When the film thickness of a recording film was in a range of 15 to 50 nm, and the recording film was in an amorphous state, the reflectivity was lowered by the interference, and a more intensified reproduced signal could be obtained. The film thickness of a reflecting layer was in a range of preferably 5 to 300 nm, more preferably 40 to 200 nm. By providing a reflecting layer, a more intensified reproduced signal could be obtained even if the film thickness of a recording film was in a lower range than that of the monolayer, as described above, and thus good characteristics could be obtained even in a composition range where the absorption coefficient of a recording a film was larger than that of the monolayer.

When the film thickness of a recording film and an intermediate layer was changed, the wavelength, at which the reflectivity of read-out light became minimum by the interference, was changed. Since the necessary minimum reflectivity for autofocusing or tracking was 10 to 15%, it was necessary that the minimum value was on a longer or shorter wavelength side than the read-out light wavelength, when the minimum value of the reflectivity was less than the said value. When the minimum value was made to be on the shorter wavelength side, the film thickness of a recording film could be made smaller, and an energy loss by heat conduction could be prevented. When the minimum value was made to be on the longer wavelength side on the other hand, the film thickness could be larger. This was preferable from the viewpoints of recording film life and prevention of noise generation at the recording and rewriting.

As a material for the reflecting layer, many semi-conductors, semi-metals, metals or their mixtures or their compounds such as Bi, Bi , Te, Sn, Sb, Al, Au, Pb, etc. could be used in place of Bi-Sb.

The recording film of Example 2 also had as good an oxidation resistance as that of Example 1, and even if there were pinholes on the protective layer, no further oxidation proceeded in the neighborhood of the pinholes.

EXAMPLE 3

A $SiO_2$ layer, about 100 nm thick, serving as a reflection-preventing layer and a protective layer at the same time was formed by magnetron sputtering on a substrate prepared in the same manner as in Example 1. Then, the substrate was placed in a vacuum evaporation apparatus having the same internal structure as in Example 1. Te, Sn and Se were placed in three evaporation boats, respectively, and Co was placed in an electron beam evaporation source. Then, the substrate was rotated at 120 rpm, and an electric current was passed to the individual boats and an electron beam was irradiated onto the electron beam evaporation source to evaporate the source materials. The evaporation rates from the respective sources were detected by a quartz-crystal type film thickness monitor and the electric currents and electron beam were controlled to make the evaporation rates constant. In this manner, a recording film having the composition of $Co_5Sn_{30}Te_{10}Se_{55}$ was vapor deposited to a film thickness of about 110 nm on the $SiO_2$ layer on the substrate. The film thickness was such that the light reflected on the surface of the recording film interfered the light reflected on the back side of the recording film and the reflectivity became substantially a minimum at the wavelength of laser beam used for the read-out when the recording film was in an amorphous state or in a poor crystallization state. Then, a protective layer having a composition substantially equal to $SiO_2$ was successively formed to a film thickness of about 100 nm thereon by magnetron sputtering. Likewise a protective layer having a composition substantially equal to $SiO_2$ on a similar substrate, and a recording film having the composition of $Co_5Sn_{30}Te_{10}Se_{55}$ and a protective layer a composition substantially equal to $SiO_2$ were successively vapor deposited thereon. UV light curing resin protective layers were formed to a film thickness of about 50 $\mu$m by coating on the respective outermost vapor-deposited layers of the thus obtained two substrates, and the substrates were joined together by pasting through an organic adhesive layer so that the UV light curing resin layers could be faced inwardly. In this manner, a disk was prepared.

Initial crystallization, recording, reproduction and erasing of the thus prepared disk were carried out in the same manner as in Example 1.

Recording and erasing could be carried out in repetitions of at least $3 \times 10^5$. Without the $SiO_2$ layers on the upper and lower recording films, the noise was slightly increased after a few repetitions of recording and erasing. In this Example, reproduced signal power of about 100 mV was obtained. The recording film according to this Example had a good oxidation resistance. For example, the recording film without formation of a $SiO_2$ layer was not substantially oxidized even if placed at 60° C. and a relative humidity of 95%.

In the foregoing recording film of Co-Sn-Te-Se system, necessary recording laser beam power and reproduced signal intensity changed as follows, when the Co content was changed, while keeping a ratio of other elements constant:

Recording laser beam power

| | |
|---|---|
| $\beta = 0$ | not recorded |
| $\beta = 0.5$ | not recorded |
| $\beta = 1$ | 12 mW |
| $\beta = 2$ | 10 mW |
| $\beta = 10$ | 10 mW |

The reproduced signal intensity was as follows:

Reproduced signal intensity

| | |
|---|---|
| $\beta = 20$ | 80 mV |
| $\beta = 25$ | 80 mV |
| $\beta = 30$ | 50 mV |
| $\beta = 60$ | 30 mV |
| $\beta = 70$ | 20 mV |

When the Sn content was changed and the temperature was increased at a constant rate, the crystallization temperature was changed as follows:

Crystallization temperature

| | |
|---|---|
| $Z = 0$ | 80° C. |
| $Z = 3$ | 120° C. |
| $Z = 10$ | 200° C. |
| $Z = 20$ | 250° C. |
| $Z = 40$ | 200° C. |
| $Z = 60$ | 120° C. |
| $Z = 70$ | Crystallized just after the film |

-continued formation

When the Se content was changed and the temperature was increased at a constant rate, the crystallization was changed as follows:

Crystallization temperature

| $\alpha = 20$ | Crystallized just after the film formation |
|---|---|
| $\alpha = 30$ | 120° C. |
| $\alpha = 40$ | 200° C. |
| $\alpha = 70$ | 200° C. |
| $\alpha = 80$ | 120° C. |

When a portion or all of Se was replaced with S, the crystallization temperature was a little lowered, but the toxicity was reduced.

When the Te content was changed while keeping a ratio of other elements in a recording film of Co-Sn-Te-Se system constant, the reproduced signal intensity and the necessary irradiation time for erasing were changed as follows:

Reproduced signal intensity

| $X = 0$ | 80 mV |
|---|---|
| $X = 10$ | 100 mV |
| $X = 20$ | 150 mV |

Necessary irradiation time for erasing

| $X = 0$ | 0.5 μs |
|---|---|
| $X = 5$ | 0.5 μs |
| $X = 10$ | 0.7 μs |
| $X = 20$ | 0.9 μs |
| $X = 30$ | 2 μs |
| $X = 40$ | 4 μs |

Addition of about 15 at. % of Te was effective for elevating the crystallization temperature. Addition of other elements represented by A was also effective for slightly increasing the sensitivity. Addition of at least one element of As, Sb, Si and Ge represented by F was also effective for stabilization of the amorphous state, etc., and addition thereof up to 70 at. % was possible, but the necessary irradiation time for erasing was prolonged unless the content was not less than 10 at. %.

It was preferable that the film thickness of a recording film was in a range of 60 to 150 nm, where a change of reflectivity by recording was increased due to the effect of light interference. Even in a range of 15 to 500 nm, recording and reproduction were possible.

At least one of Pb, Bi, Zn, Cd, In and Ga could be added in place of a portion or all of Sn, whereby quite similar characteristics could be obtained with a little less oxidation resistance. Pb and In were preferable elements among them. At least one of Cu, Ag, Au, Al, Sc, Y, Ni, Zr, V, Nb, Cr, Mo, Mu, Fe, Ru, Ti, Rh, Hf, Ta, W, Ir, and Pt could be added in place of a portion or all of Co, whereby quite similar characteristics could be obtained. At least one of Ti, V, Cr, Mn, Ni, Zr and Pd was preferable among them, because of easy vapor deposition. Presence of at least one of Sn, In, Ga, Pb, Bi, Zn and Cd together with an element of Co, Ni, etc. made the amorphous state stable and gave a higher erasing speed as advantages.

Films of other materials disclosed in Example 1, such as SiO, etc. could be used as a protective film.

EXAMPLE 4

A $SiO_2$ layer, about 100 nm thick, serving as a reflection-preventing layer and a protective layer was formed by magnetron sputtering on a substrate prepared in the same manner as in Example 1. Then, the substrate was placed in a vacuum evaporation apparatus having the same internal structure as shown in Example 1.

Tl, In and Se were placed in three evaporation boats, respectively, and Co was placed in an electron beam evaporation source. The substrate was rotated at 120 rpm, and an electric current was passed to the individual boats, and an electron beam was irradiated onto the electron beam evaporation source to evaporate the source materials.

The evaporation rates from the individual evaporation sources were detected by quartz crystal type film thickness monitor, and the electric current was controlled to make the evaporation rates constant. In this manner, a recording film having the composition of $Co_3Tl_5In_{52}Se_{40}$ was vapor deposited to a film thickness of about 110 nm on the $SiO_2$ layer on the substrate. The film thickness was such that the light reflected on the surface of the recording film interfered the light reflected on the back side of the recording film and the reflectivity became substantially a nimimum at the wavelength of laser beam used for the read-out when the recording film was in an amorphous state or in a poor crystallization state. Then, a protective layer having a composition substantially equal to $SiO_2$ was successively formed to a film thickness of about 100 nm thereon by magnetron sputtering. Likewise, a protective layer having a composition substantially equal to $SiO_2$ on a similar substrate, and a recording film having the composition of $Co_3Tl_5In_{52}Se_{40}$ and a protective layer having a composition substantially equal to $SiO_2$ were successively vapor deposited thereon. The thus prepared two substrates were joined together by pasting through an organic adhesive layer so that the said protective layers could be faced inwardly. In this manner, a disk was prepared.

Recording, reproduction and erasing of the thus prepared disk were carried out in the following manner.

The disk was rotated at 3,600 rpm, and one of the recording films was exposed to a beam of argon ion laser (wavelength: 488 nm), kept at a non-recording level and condensed by a lens in the recording head, through the substrate. The reflected light was detected to drive the head so that the center of the light spot could always fall onto the intermediate part between the tracking grooves. The influence of noises generated from the grooves could be prevented by making the intermediate part between the grooves a recording track. Automatic focusing was carried out so that the focus could fall on the recording film while conducting the tracking in this manner. At first, the recording film on the recording track was once melted by continuous irradiation of a laser beam of high power density, and then cooled, whereby the individual elements were subjected to reaction. Then, the intertrack parts were likewise treated. Then, the part between the recording tracks were crystallized by continuous irradiation of a laser beam of low power density having an elliptical light spot with a long axis in the track direction. The foregoing operations were carried out in the apparatus solely destined to the initialization of the disk. Furthermore, the tracks were somewhat incompletely crystallized rather than the intertrack parts by continuous irradiation of a laser beam of low power density having a circular spot. The purpose to thoroughly crystallize the intertrack parts was to gradually and unevenly crystallize the intertrack parts at the recording and rewriting to prevent noise generation. An appropriate laser power range for the formation of an amorphous state was higher than the power for the crystallization and lower than the power capable of causing a remarkable transformation or making holes. An appropriate laser power range for the crystallization was high enough to cause the crystallization and lower than the power for causing formation of an amorphous state.

Recording in the optical disk drive (recording and reproducing apparatus) was carried out in the following manner.

The disk was rotated at 1,200 rpm, and one of the recording films was exposed to a beam of semiconductor laser (wavelength: 820 nm), kept at a non-recording power level (about 1 mW) and condensed by a lens in the recording head, through the substrate. The reflected light was detected to drive the head so that the center of the light spot could always fall onto the intermediate part between the tracking grooves, whereby the influence of noises generated from the grooves could be prevented. Automatic focusing was carried out so that the focus could fall on the recording film while conducting the tracking in this manner, and in the recording part recording was carried out by changing a laser power between 7 mW at which the crystallization took place, and 12 mW at which formation of an amorphous state took place, as shown in FIG. 4. The amorphous portion in the recorded part was regarded as a recording point. After the recording part, the laser power was lowered to 1 mW, and the tracking and automatic focusing were continued. During the recording, the tracking and autofocusing were continued. When such recording procedure was applied to the already recorded part, the recorded information was replaced with newly recorded information. That is, it was possible to make overwriting by a single circular light spot. It is the feature of the present recording film material as disclosed in this Example and other Examples that such overwriting is possible in this manner.

Recording and erasing could be carried out in repetitions of at least $3 \times 10^5$. Without the $SiO_2$ layers over and below recording films, the noise was slightly increased after a few repetitions of recording and erasing.

Read-out was carried out in the following manner.

The disk was rotated at 1,200 rpm, and the intensity of reflected light of semi-conductor laser beam with such a low power not enough to effect recording and erasing was detected to reproduce information, while conducting the tracking and autofocusing in the same manner as in the recording. In this Example, reproduced signal voltage of about 100 mV was obtained. The recording film according to this Example had a good oxidation resistance. For example, the recording film without formation of the $SiO_2$ protective layer was not substantially oxidized even if placed at 60° C. and a relative humidity of 95%.

In the foregoing recording film of Co-Tl-In-Se system, the necessary recording laser beam power and reproduced signal intensity were changed as follows, when the Co content was changed, while keeping ratio of other elements constant.

|  | Recording laser beam power | Crystallization temperature |
|---|---|---|
| $\beta = 0$ | 12 mW | 140° C. |
| $\beta = 0.5$ | 12 mW | 160° C. |
| $\beta = 1$ | 10 mW | 180° C. |
| $\beta = 2$ | 8 mW | 200° C. |
| $\beta = 10$ | 8 mW | 300° C. |

The reproduced signal intensity was given below:

Reproduced signal intensity

| $\beta = 20$ | 80 mV |
|---|---|
| $\beta = 25$ | 80 mV |
| $\beta = 30$ | 50 mV |
| $\beta = 60$ | 30 mV |
| $\beta = 70$ | 20 mV |

When the In content was changed while keeping a ratio of other elements constant, the crystallization temperature, measured by increasing the temperature at a constant rate, was changed as follows:

|  | Crystallization temperature | Noise level (relative) |
|---|---|---|
| $Z = 0$ | 100° C. | 0 dB |
| $Z = 20$ | 150° C. | 0 dB |
| $Z = 25$ | 180° C. | 0 dB |
| $Z = 50$ | 200° C. | +1 dB |
| $Z = 60$ | 180° C. | +30 dB |
| $Z = 70$ | 150° C. | +40 dB |
| $Z = 80$ | Crystallized just after the film formation | +40 dB |

When the Se content was changed while keeping a ratio of other elements constant, the crystallization temperature, measured by increasing the temperature at a constant rate, was changed as follows:

Crystallization temperature

| $\alpha = 20$ | crystallized just after the film formation |
|---|---|
| $\alpha = 30$ | 120° C. |
| $\alpha = 40$ | 200° C. |
| $\alpha = 70$ | 200° C. |
| $\alpha = 80$ | 120° C. |

When a portion or all of Se was replaced with S, the crystallization temperature was a little lowered, but the toxicity was reduced.

When the Tl content was changed while keeping a ratio of the elements in the recording film of Co-Tl-In-Se system constant, the crystallization temperature and the necessary irradiation time for erasing were changed as follows:

Crystallization temperature

| $Y = 0$ | 300° C. |
|---|---|
| $Y = 15$ | 280° C. |
| $Y = 30$ | 250° C. |
| $Y = 60$ | 170° C. |
| $Y = 70$ | 100° C. |

Necessary irradiation time for erasing

| | |
|---|---|
| Y = 0 | 1.0 μs |
| Y = 1 | 0.5 μs |
| Y = 2 | 0.3 μs |
| Y = 15 | 0.3 μs |

Addition of about 15 at. % of Te was effective for elevating the crystallization temperature. Addition of other elements represented by A was also effective for slightly increasing the sensitivity.

It was preferable that the film thickness of a recording film was in a range of 80 to 150 nm and in a range of 180 to 300 nm, where a change of reflectivity by recording was increased due to the effect of light interference. In a range of smaller film thickness, the cooling speed was high after the laser irradiation, and formation of an amorphous state was assured. Even in a range of 15 to 500 nm, recording and reproduction were possible.

At least one of Sn, Pb, Bi, Zn, Cd and Ga could be added in place of a portion or all of In, whereby quite similar characteristics could be obtained with a little less oxidation resistance. Sn is a preferable element among them. At least one of Cu, Ag, Au, Al, Sc, Y, Ni, Zr, V, Nb, Cr, Mo, Mn, Fe, Ru, Ti, Rh, Hf, Ta, W, Ir and Pt could be added in place of a portion or all of Co, whereby quite similar characteristics could be obtained. Among them, at least one of Ti, V, Cr, Mn, Ni, Zr and Pd was preferable, because of easy vapor deposition. Presence of at least one of Sn, In, Ga, Pb, Bi, Zn and Cd together with an element of Co, Ni, etc. gave a higher crystallization temperature as an advantage. At least one of halogens and alkali metals could be added in place of a portion or all of Tl, whereby quite similar characteristics could be obtained. Among the halogen elements F, Cl, Br and I, I is particularly preferable and Cl is next preferable. Among the alkali metals, Li, Na, K, Rb and Cs, Na is particularly preferable and K is next preferable.

In place of $SiO_2$ as a protective film, SiO, $Y_2O_3$, $ZrO_2$, $TiO_2$, nitrides such as TaN, AlN, etc., sulfides such as $Sb_2S_3$, etc., fluorides such as CeF, etc., and composition similar to amorphous Si, $TiB_2$, $B_4C$, B, C, etc. could be also used. Multilayered (double or more than double) inorganic protective layers had better protection effect.

EXAMPLE 5

A polycarbonate plate having tracking grooves on the surface, formed by injection molding, was used as a substrate, and a 400 nm-thick protective film was formed thereon by sputtering, using Teflon as a target. Then, a recording film, 30 nm thick, having a composition of $Tl_5In_{40}Sb_5Se_{50}$ was formed thereon. Successively, an intermediate layer, 20 nm thick, having a composition substantially equal to $SiO_2$, then a reflecting layer, 60 nm thick, having a composition of $Bi_{70}Sb_{30}$, and a protective layer 30, 400 nm thick, by sputtering using Teflon as a target were formed thereon. Likewise, another substrate with various similar layers thereon was prepared, and UV curing resin layers, each about 20 μm thick, were formed by coating and curing on the outermost protective layers of both substrates, respectively, and a disk was prepared by joining the two substrates together by pasting with a hot melt adhesive containing a black pigment, so that the UV curing resin layers could be faced inwardly.

Crystallization, recording, erasing and readout were carried out in the same manner as in Example 1.

The amount of Sb to be added could be increased up to 70 at. %, and in a range of 10 at. % of Sb, erasing by crystallization could be carried out at a high speed.

Other inorganic transparent materials such as $GeO_2$, $Al_2O_3$, $GeO_2$, $Y_2O_3$, SiO, AlN, TaN, $Si_3N_4$, etc. as, for example, mentioned to be applicable as a protective layer in Example 1, could be used for the intermediate layer in place of $SiO_2$, or an organic material layer could be used. When the intermediate layer had a film thickness of 3 to 40 nm, a mutual diffusion between the recording film and the reflecting layer could be prevented at the recording and rewriting, but optically it could be regarded that there was substantially no intermediate layer. That is, a change of reflectivity by wavelength due to the light interference was similar to that of a two-layer structure of recording film and reflecting layer.

When the reflecting layer also underwent an atomic configuration change at the recording, the reproduced signal was a little intensified.

A portion or all of the individual elements represented by B, C, D, E and F, contained in the recording film could be replaced with at least one of other elements in the same groups. At least one of the elements in group A, such as Al, etc. could be added in an amount of not more than 30 at. % without any trouble. However, not more than 20 at. % thereof was preferable with respect to the SN ratio.

When the film thickness of a recording film was in a range of 15 to 50 nm, and the recording film was in an amorphous state, the reflectivity was lowered by the interference, and a more intensified reproduced signal could be obtained. The film thickness of a reflecting layer was in a range of preferably 5 to 300 nm, more preferably 40 to 200 nm. By providing a reflecting layer, a more intensified reproduced signal could be obtained even if the film thickness of a recording film was in a lower range than that of the monolayer, as described above, and thus good characteristics could be obtained even in a composition range where the absorption coefficient of a recording film was larger than that of the monolayer.

When an inorganic material protective layer was provided at least on one of the boundary between the Teflon-sputtered protective layer and the recording layer and the boundary between the Teflon-sputtered protective layer and the reflective layer, the SN ratio lowering could be further inhibited at the recording and rewriting.

When the film thickness of a recording film and an intermediate layer was changed, the wavelength, at which reflectivity of read-out light became a minimum by the interference, was changed. Since the necessary minimum reflectivity for autofocusing or tracking was 10 to 15%, it was necessary that the minimum value was on a longer or shorter wavelength side than the read-out light wavelength, when the minimum value of the reflectivity was less than the said value. When the minimum value was made to be on the shorter wavelength side, the film thickness of a recording film could be made smaller, and an energy loss by heat conduction could be prevented. When the minimum value was made to be on the longer wavelength side on the other hand, the film thickness could be larger. This was preferable from the viewpoints of recording film life and prevention of noise generation at the recording and rewriting.

As a material for the reflecting layer, many semi-conductors, semi-metals, metals or their mixtures or their compounds such as Bi, $Bi_2Te_3$, Te, Sn, Sb, Al, Au, Pb, etc. could be used in place of Bi-Sb.

The recording film of Example 5 also had as good an oxidation resistance as that of Example 1, and even if there were pinholes on the protective layer, no further oxidation proceeded in the neighborhood of the pinholes.

As described in detail in the foregoing, an information-recording member having a good reproducibility, good recording and reproducing characteristics and a long stability can be obtained by a simple method in the present invention. Rewriting of recording can be made in a large number of repetitions.

What is claimed is:

1. An information recording thin film capable of changing an atomic configuration upon exposure to a recording beam, formed on a substrate directly or through a protective layer composed of at least one of inorganic materials and organic materials, an average composition in the film thickness direction of the information-recording thin film being represented by the following general formula:

$$A_X B_Y C_Z D_\alpha E_\beta F_\gamma$$

wherein X, Y, Z, $\alpha$, $\beta$ and $\gamma$ are in ranges of $0 \leq X+\beta < 20$, $1 \leq Y \leq 30$, $25 \leq Z+\gamma \leq 60$, $25 \leq Z \leq 60$ and $35 \leq \alpha \leq 70$ in atomic percentage, F is at least one element of As, Sb, Si, and Ge; E is at least one element of Cu, Ag, Au, Sc, Y, Ti, Zr, V, Nb, Cr, Mo, Mn, Fe, Co, Rh, Ni, and Pd; D is at least one element of Se and S; C is at least one element of Sn, Pb, Bi, Zn, Cd, Ga and In; B is at least one element of Tl, halogen elements and alkali metal elements; and A is at least one of other elements than those represented by B, C, D, E and F.

2. An information-recording thin film according to claim 1, wherein the element represented by D in the general formula is Se.

3. An information-recording thin film according to claim 1, wherein the element represented by C in the general formula is In.

4. A method for recording and reproducing information which comprises a step of exposing to a recording beam an information-recording thin film provided on a substrate direction or through a protective layer, an average composition of the thin being represented by the general formula:

$$A_X B_Y C_Z D_\alpha E_\beta F_\gamma$$

wherein X, Y, Z, $\alpha$, $\beta$ and $\gamma$ are in ranges of $0 \leq X+\beta < 20$, $1 \leq Y \leq 30$, $25 \leq Z+\gamma \leq 60$, $25 \leq Z \leq 60$ and $35 \leq \alpha \leq 70$ in atomic percentage, F is at least one element of As, Sb, Si, and Ge; E is at least one element of Cu, Ag, Au, Sc, Y, Ti, Zr, V, Nb, Cr, Mo, Mn, Fe, Co, Rh, Ni, and Pd,; D is at least one element of Se and S; C is at lest one element of Sn, Pb, Bi, Zn, Cd, Ga and In; B is at least one element of Tl, halogen elements and alkali metal elements; and A is at least one of other elements than those represented by B, C, D, E and F, thereby changing the atomic configuration at the exposed part of the thin film, and a step of exposing a reproducing beam to the thin film, thereby reading out the change in the atomic configuration.

5. A method according to claim 4, wherein the recording beam is a laser beam.

6. A method according to claim 4, wherein the element represented by D in the general formula is Se.

* * * * *